United States Patent
Chu

(10) Patent No.: US 11,262,783 B2
(45) Date of Patent: Mar. 1, 2022

(54) SYSTEMS AND METHODS FOR INITIALIZING BANDGAP CIRCUITS

(71) Applicant: Micron Technology, Inc., Boise, ID (US)

(72) Inventor: Wei Lu Chu, Xuhui District (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/096,638

(22) PCT Filed: Aug. 28, 2018

(86) PCT No.: PCT/CN2018/102762
§ 371 (c)(1),
(2) Date: Oct. 25, 2018

(87) PCT Pub. No.: WO2020/041980
PCT Pub. Date: Mar. 5, 2020

(65) Prior Publication Data
US 2021/0232171 A1     Jul. 29, 2021

(51) Int. Cl.
| | | |
|---|---|---|
| *G05F 1/10* | (2006.01) | |
| *G05F 3/30* | (2006.01) | |
| *G05F 1/46* | (2006.01) | |
| *G05F 3/02* | (2006.01) | |
| *H03K 17/22* | (2006.01) | |

(52) U.S. Cl.
CPC ............... *G05F 3/30* (2013.01); *G05F 1/10* (2013.01); *G05F 1/468* (2013.01); *G05F 3/02* (2013.01); *H03K 17/22* (2013.01)

(58) Field of Classification Search
CPC ... G05F 1/10; G05F 1/46; G05F 1/461; G05F 1/468; G05F 3/02; G05F 3/08; G05F 3/10; G05F 3/16; G05F 3/24; G05F 3/247; G05F 3/26; G05F 3/262; G05F 3/30; H03K 17/22
See application file for complete search history.

(56) References Cited

U.S. PATENT DOCUMENTS 5,867,013 A * 2/1999 Yu .............................. G05F 3/30
                                                               323/314
6,933,769 B2    8/2005   Koelling
(Continued)

FOREIGN PATENT DOCUMENTS

| CN | 101470458 A | 7/2009 |
|---|---|---|
| CN | 107305400 A | 10/2017 |

OTHER PUBLICATIONS

Notification of Transmittal of the International Search Report and the Written Opinion of the International Searching Authority, or the Declaration for Application No. PCT/CN2018/102762 dated May 20, 2019, 9 pps.

*Primary Examiner* — Long Nguyen
(74) *Attorney, Agent, or Firm* — Fletcher Yoder, P.C.

(57) ABSTRACT

A semiconductor device may include a bandgap circuit that outputs a reference voltage. The semiconductor device may also include a startup circuit coupled to the bandgap circuit. The startup circuit may connect a voltage source to a node that corresponds to an output of the bandgap circuit in response to the bandgap circuit being initialized. The startup circuit may also disconnect the voltage source from the node in response to the reference voltage being greater than a threshold.

19 Claims, 4 Drawing Sheets

(56) References Cited

U.S. PATENT DOCUMENTS

| | | | |
|---|---|---|---|
| 7,208,929 B1 * | 4/2007 | Rabeyrin | G05F 1/468 323/313 |
| 7,605,577 B2 | 10/2009 | Chung | |
| 2008/0007244 A1 | 1/2008 | Draxelmayr | |

* cited by examiner

US 11,262,783 B2

SYSTEMS AND METHODS FOR INITIALIZING BANDGAP CIRCUITS

CROSS-REFERENCE TO RELATED APPLICATIONS

This application is a National Phase 371 Application of PCT Application No. PCT/CN2018/102762, filed Aug. 28, 2018, entitled "SYSTEMS AND METHODS FOR INITIALIZING BANDGAP CIRCUITS".

BACKGROUND

Field of the Present Disclosure

Embodiments of the present disclosure relate generally to the field of bandgap circuits. More specifically, embodiments of the present disclosure relate to startup circuits used to initialize bandgap circuits.

Description of Related Art

Electronic devices, such as semiconductor devices, memory chips, microprocessor chips, image chips, and the like, may use a reference voltage to perform various tasks and operations. For example, reference voltages are used to provide consistent power supplies and current supplies, such that a corresponding electronic device (e.g., memory device) may accurately perform its operation. As such, bandgap reference circuits may be incorporated with an electronic device to provide reference voltages due to their ability to maintain stable output voltages that does not vary with temperature and supply voltage. When initializing a bandgap reference circuit, a startup circuit may be employed to enable the bandgap reference circuit to ramp its output voltage to some value, after which the bandgap reference circuit may be able to maintain a constant reference voltage output. As circuit components (e.g., switches) of the startup circuits are produced more frequently by various manufacturers and using various processes, different startup circuits may operate according to the different electrical properties (e.g., input voltage, threshold voltage). With this in mind, it is desirable to provide improved systems and methods for initializing bandgap reference circuits.

DETAILED DESCRIPTION

Figure 1:
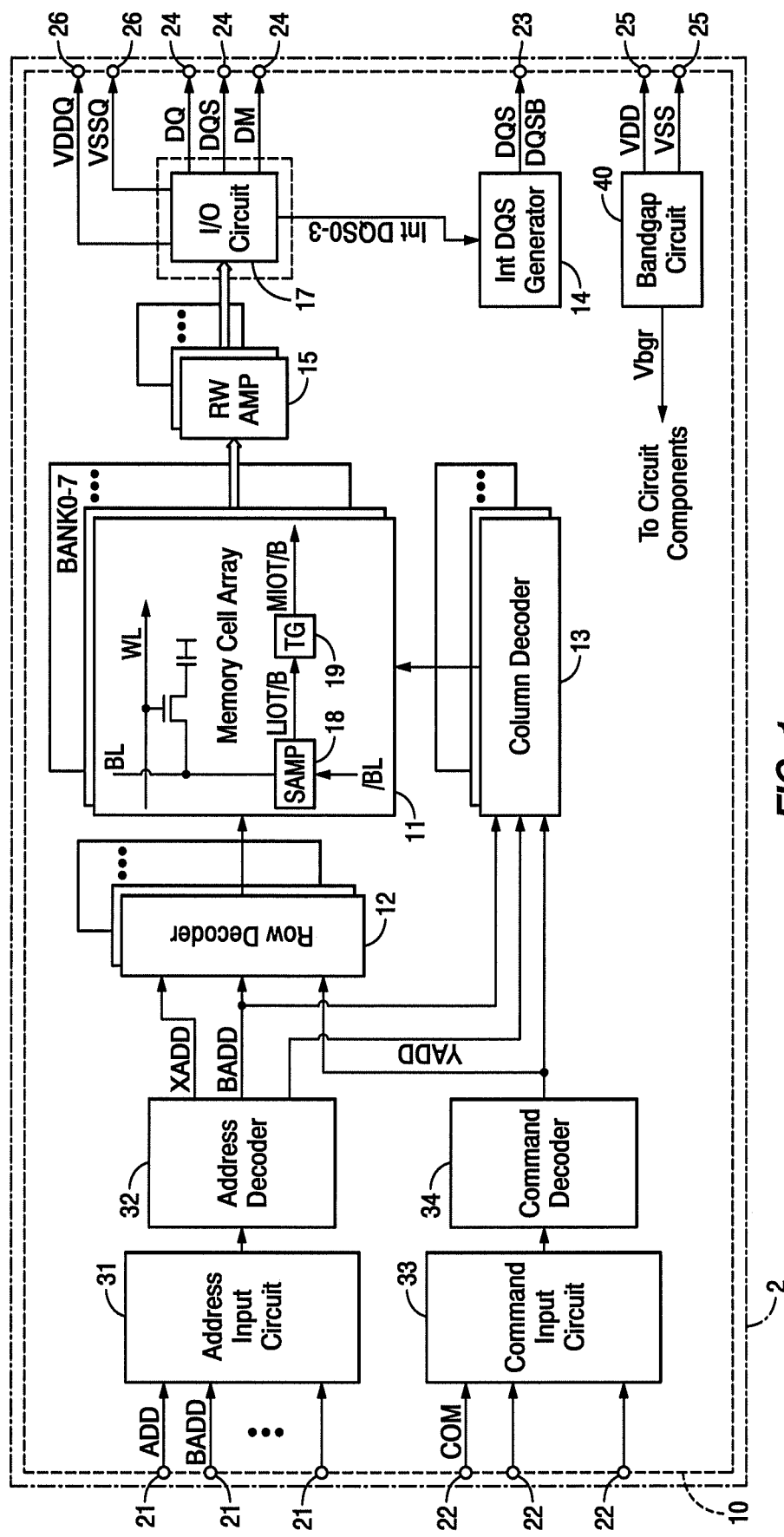
FIG. 1 is a simplified block diagram illustrating a semiconductor device that includes a bandgap circuit, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain semiconductor devices (e.g., memory devices) may use bandgap circuits to provide a constant reference voltage, thereby enabling the semiconductor devices to perform their operations accurately. Generally, the bandgap circuit outputs a voltage ($V_{bgr}$) that stabilizes at some voltage level, such that the output voltage $V_{bgr}$ is fixed (e.g., constant) regardless of power supply variations, temperature changes, various circuit loads, and the like. Prior to the bandgap circuit outputting a stable output voltage $V_{bgr}$, a startup circuit may be used to ramp the output voltage $V_{bgr}$ up until the bandgap circuit reaches an operation state (e.g., voltage) that enables the bandgap circuit to operate at a stable state. That is, the bandgap circuit operates at a normal operational state, where the output voltage $V_{bgr}$ is a constant voltage (e.g., 1.25 volts), and at an initial state where the bandgap circuit does not output a voltage.

With this in mind, the startup circuit may assist the bandgap circuit to initialize itself while the bandgap circuit is ramping up its power. However, if the startup circuit does not ramp up the power of the bandgap circuit in an expected manner, the bandgap circuit may not operate accurately. That is, if the bandgap circuit cannot startup correctly, it may output a reference voltage $V_{bgr}$ that may not match the expected voltage to be received by other circuit components, thereby causing the corresponding electronic device to operate inefficiently or incorrectly.

In certain instances, the startup circuit may not operate consistently across various process, voltage, temperature (PVT) corners or values, thereby prohibiting the bandgap circuit from starting up correctly. In particular, as the process variation for circuit components in the startup circuit and the bandgap circuit varies, the startup circuit may not consistently cause the bandgap circuit to ramp up its voltage to the normal operation state. With this in mind, the embodiments described herein include a startup circuit that operates more consistently across a range of PVT corners. For example, the startup circuit may include a comparator circuit that is a scaled down replica of the amplifier circuit used in the bandgap circuit. The replica design of the startup circuit may allow the startup circuit to mimic the operation of the bandgap circuit, thereby enabling the two circuits to operate in conjunction with each other.

In certain embodiments, the startup circuit may initialize and output a low voltage gate signal to a P-type switch that may couple a voltage source VPP to a node coupled to the output voltage $V_{bgr}$. As the startup circuit initializes the output voltage $V_{bgr}$, the bandgap circuit may concurrently ramp up its voltage. After the current $I_{bgr}$ reaches its peak, the bandgap circuit may operate without the assistance of the startup circuit providing a connection between the voltage source VPP and the output voltage $V_{bgr}$. As such, the startup circuit may be designed such that its comparator circuit may output a high voltage gate signal after the output voltage $V_{bgr}$ reaches some voltage value that corresponds to the bandgap circuit being capable of sustaining its normal operation. The high voltage gate signal may be provided to the P-type switch that may couple the voltage source VPP to the node coupled to the output voltage $V_{bgr}$, thereby disconnecting the voltage source VPP to the node coupled to the output voltage $V_{bgr}$ and powering down the startup circuit.

By incorporating a comparator circuit in the startup circuit that is a scaled-down (e.g., 1/8) replica circuit of the amplifier circuit in the bandgap circuit, the startup circuit may mirror the operation of the bandgap circuit to turn off at an appropriate time to allow the bandgap circuit to perform output the output voltage $V_{bgr}$. Moreover, the startup circuit described herein may assist the amplifier components of the bandgap circuit to operate consistently across various ranges of process, voltage, and temperature conditions. Additional details with regard to initializing the operation of a bandgap circuit will be described below with reference to FIGS. 1-6.

Turning now to the figures, FIG. 1 is a block diagram of a semiconductor device in accordance with an embodiment of the present disclosure. That is, for example, the semiconductor device 10 may use a bandgap circuit to perform various operations. Although the following description of the semiconductor device and the bandgap circuit will be described in the context of a memory device, it should be noted that the embodiments described herein regarding the bandgap circuit may be employed for any suitable electronic device. Indeed, the description of the memory device below is provided to explain certain aspects of the bandgap circuit and the startup circuit of the present disclosure, and, as such, the embodiments described herein should not be limited to memory devices.

Referring now to FIG. 1, a semiconductor device 10 may be any suitable memory device, such as a low power double data rate type 4 (LPDDR4) synchronous dynamic random access memory (SDRAM) integrated into a single semiconductor chip, for example. The semiconductor device 10 may be mounted on an external substrate 2 that is a memory module substrate, a mother board or the like. The semiconductor device 10 may include a plurality of memory banks each having a plurality of memory cell arrays 11. Each memory cell array 11 may include a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local input/output (I/O) line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, data strobe (DQS) terminals 23, data (DQ) terminals 24 and power supply terminals 25 and 26. The data terminals 24 may be coupled to output buffers for read operations of memories. Alternatively, the data terminals 24 may be coupled to input butters for read/write access of the memories.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 22 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line.

Although the address terminals 21 and the command terminals 22 are illustrated in FIG. 1 as being separate terminals, it should be noted that in some embodiments the address input circuit 31 and the command input circuit 33 may receive address signals ADD and command signals COM via one or more address and command terminals. That is, the address signals ADD and command signals COM may be provided to the semiconductor device 10 via the same terminal. For instance, the address and command terminals may provide an address signal at a falling clock edge (e.g., in synchronism with clock falling edge) and a command signal at a rising clock edge (e.g., in synchronism with clock rising edge). With this in mind, it should be understood that the description provided in the present disclosure with the separate address terminals 21 and command terminals 22 is included for discussion purposes and the techniques described herein should not be limited to using separate address terminals 21 and command terminals 22.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output (IO) circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address.

The input/output circuit 17 may include input buffers, according to one embodiment. The input/output circuit 17 receives external clock signals as a timing signal for determining input timing of write data DQ and output timing of read data DQ. Power supply potentials VDDQ and VSSQ are supplied to the input/output circuit 17. The power supply potentials VDDQ and VSSQ may be the same potentials as power supply potentials VDD and VSS that are supplied to power supply terminals 25, respectively, which will be described below. However, the dedicated power supply potentials VDDQ and VSSQ may be used for the input/ output circuit 17 so that power supply noise generated by the input/output circuit 17 does not propagate to the other circuit blocks.

The power supply terminals 25 are supplied with power supply potentials VDD and VSS. These power supply potentials VDD and VSS are supplied to a bandgap circuit 40. In some embodiments, the bandgap circuit 40 may be a voltage reference circuit that outputs a constant (e.g., fixed) voltage independent of power supply variations, temperature changes, circuit loading, process variations, and the like. The bandgap circuit 40 may, in some embodiments, generate various internal potentials VPP, VOD, VARY, VPERI, and the like to provide to various circuit components of the semiconductor device 10. For example, the internal potential VPP may be mainly used in the row decoder 12, the internal potentials VOD and VARY may be mainly used in the sense amplifiers 18 included in the memory cell array 11, and the internal potential VPERI may be used in many other circuit blocks.

Figure 2:
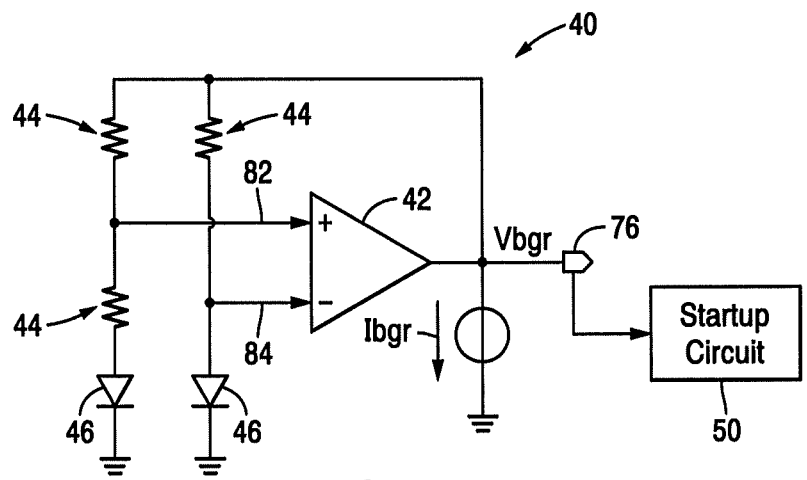
FIG. 2 is a schematic diagram illustrating a bandgap circuit having a startup circuit that may be part of the semiconductor device of FIG. 1, according to an embodiment of the present disclosure.

By way of example, FIG. 2 illustrates a schematic diagram of the bandgap circuit 40 in accordance with embodiments described herein. As shown in FIG. 2, the bandgap circuit 40 may include a differential op-amp circuit 42, resistors 44, and diodes 46. As mentioned above, the bandgap circuit 40 may produce the output voltage $V_{bgr}$, which may be a constant voltage. The bandgap circuit 40 may also include a startup circuit 50 that may assist the bandgap circuit 40 initialize and produce the output voltage $V_{bgr}$ during an initialization period before the bandgap circuit 40 has ramped up its voltage to operate a steady state generating the output voltage $V_{bgr}$. Additional details with regard to the startup circuit 50 will be described below with reference to FIGS. 4 and 5.

Figure 3:
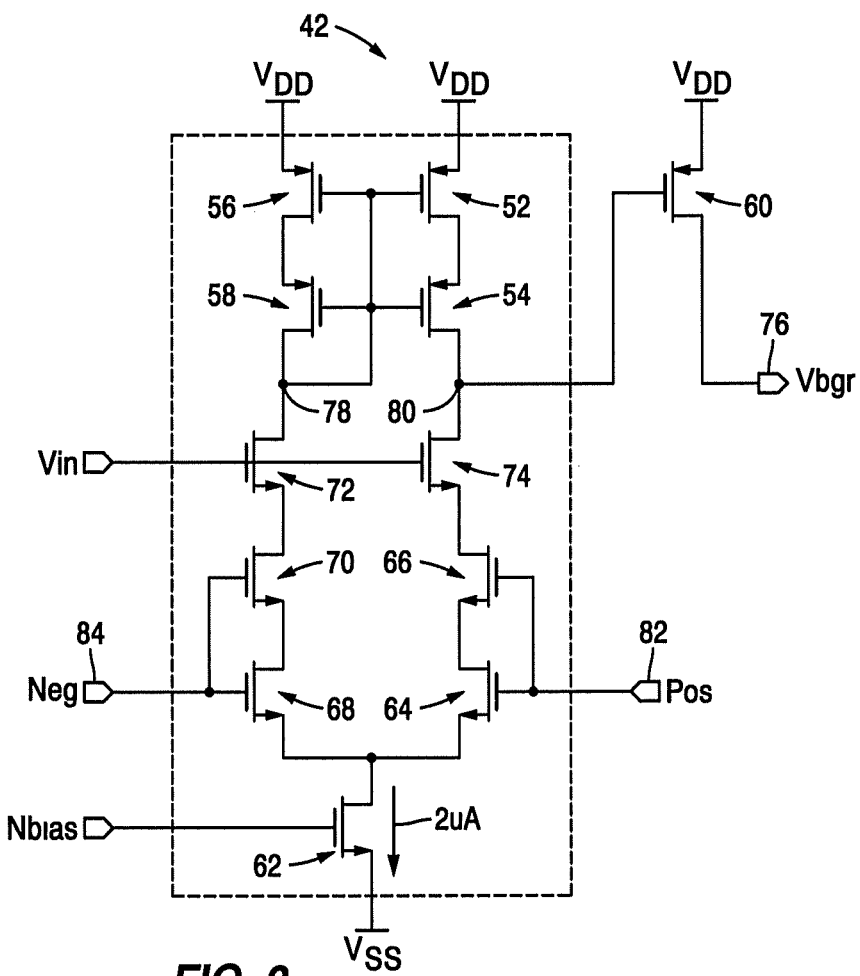
FIG. 3 is a schematic diagram illustrating a transistor-level view of a differential amplifier that may be part of the bandgap circuit of FIG. 2, according to an embodiment of the present disclosure.

FIG. 3 illustrates a transistor-level view of the differential op-amp circuit 42 that is part of the bandgap circuit 40. As shown in FIG. 3, the differential op-amp circuit 42 includes a number of P-type switches 52, 54, 56, 58, 60 and a number of N-type switches 62, 64, 66, 68, 72, 74. It should be noted that the P-type switches and the N-type switches described herein may include any suitable transistor-type switch such as a Bipolar junction transistor, a field-effect transistor, and the like. In addition, although certain embodiments described herein are depicted as using P-type switches or N-type switches, it should be understood that the polarity of the switches may be reversed by reversing the input signal polarity, connection, or the like.

By way of operation, voltage source nbias is provided to the gate of switch 62, and voltage source $V_{in}$ is provided to the gates of switches 72 and 74. The voltage sources nbias and $V_{in}$ may be stable positive voltages that are above the threshold voltages of the respective switches 62, 72, and 74. As such, the switches 62, 72, and 74 may close after receiving the respective gate voltages, thereby connecting node 78 to the source of switch 70 and node 80 to the source of switch 66.

Keeping this in mind, positive terminal 82 and negative terminal 84 correspond to the input terminals of the differential op-amp circuit 42, as shown in FIG. 2. As such, when the positive terminal 82 corresponds to a positive voltage above a gate threshold of the switches 64 and 66, the switches 64 and 66 close and couple voltage source VSS (e.g., electrical ground, negative voltage) to the node 80. As the node 80 reaches a voltage value that corresponds to the voltage source VSS, the switch 60 may close, thereby connecting voltage source VDD (e.g., high voltage, positive voltage) to node 76 and produce the output voltage $V_{bgr}$.

After the differential op-amp circuit 42 generates the output voltage $V_{bgr}$, it may stabilize itself to produce the constant output voltage $V_{bgr}$.

During the initialization of the bandgap circuit 40, however, the output voltage $V_{bgr}$ may not reach a certain voltage level (e.g., $V_{on}$) to enable the differential op-amp circuit 42 to pull the output voltage $V_{bgr}$ up and stabilize itself. That is, due to variations in process, voltage, and temperature, the differential op-amp circuit 42 may not behave or operate in a consistent manner. As such, in certain embodiments, the startup circuit 50 may enable the bandgap circuit 40 to increase the output voltage $V_{bgr}$ during the initialization of the differential op-amp circuit 42 and shut down after the differential op-amp circuit 42 reaches a certain voltage level when the differential op-amp circuit 42 stabilizes and independently outputs the output voltage $V_{bgr}$.

Figure 4:
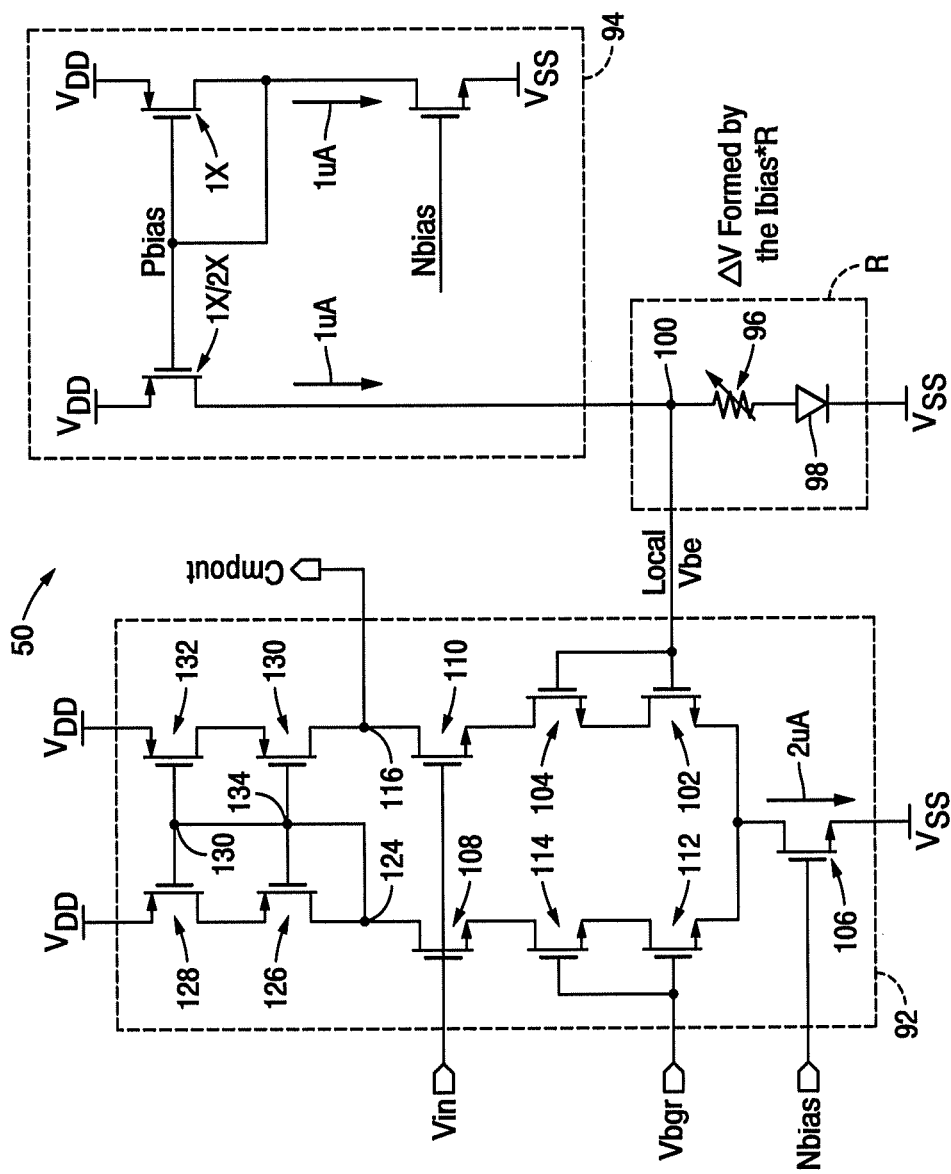
FIG. 4 is a schematic diagram illustrating a transistor-level view of a startup circuit that may be part of the bandgap circuit of FIG. 2, according to an embodiment of the present disclosure.

Keeping this in mind, FIG. 4 illustrates a circuit diagram of a first portion of the startup circuit 50. As shown in FIG. 4, the startup circuit 50 may include a comparator circuit 92 that mimics the differential op-amp circuit 42 of the bandgap circuit 40. In certain embodiments, the comparator circuit 92 may be a scaled-down (e.g., $\frac{1}{8}^{th}$) version of the differential op-amp circuit 42. The scaled-down version of the differential op-amp circuit 42 may include switches that are smaller in size and rating, as compared to switches in the differential op-amp circuit 42. Moreover, the startup circuit 50 may operate similar to the differential op-amp circuit 42, except with scaled-down voltage and current levels. By using the comparator circuit 92 that mimics the operation of the differential op-amp circuit 42, the comparator circuit 92 may operate in the same manner as the differential op-amp circuit 42, thereby reducing the effects of process, voltage, and temperature variations in manufacturing of the differential op-amp circuit 42.

Although the comparator circuit 92 is described as a scaled-down version of the differential op-amp circuit 42, it should be noted that the comparator circuit 92 may undertake any suitable size. However, it may be desirable to use a scaled-down replica of the differential op-amp circuit 42 to reduce current consumption of the startup circuit 50 and reduce the size of the startup circuit 50.

Referring back to FIG. 2, the startup circuit 50 may also include a current mirror circuit 94 that produces a 1 μA current that conducts through a variable resistor 96, which is coupled to a diode 98. The 1 μA current across the variable resistor 96 may generate a local voltage $V_{be}$ at node 100. The local voltage $V_{be}$ may be coupled to gates of N-type switches 102 and 104 and may cause the switches 102 and 104 to close. It should be noted that the variable resistor 96 is provided herein to allow the startup circuit 50 to vary the local voltage $V_{be}$ to accommodate different process, voltage, and temperature variations. In addition, it should be noted that the switches in the current mirror circuit 94 are controlled by the voltage source nbias and a voltage source pbias, which operates similar to the voltage source nbias except with an opposite polarity.

As shown in FIG. 4, the voltage source nbias may be coupled to the gate of N-type switch 106 and the voltage source Vin may be coupled to the gate of N-type switches 108 and 110. In addition, the output voltage $V_{bgr}$ may be coupled to N-type switches 112 and 114.

Figure 5:
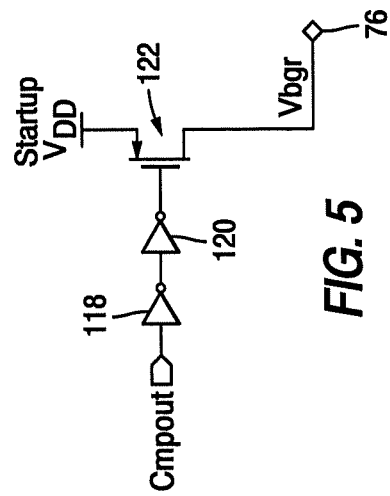
FIG. 5 is a schematic diagram illustrating an output portion of the startup circuit of FIG. 4, according to an embodiment of the present disclosure.

By way of operation, when the bandgap circuit 40 is initialized, the output voltage $V_{bgr}$ is initially 0 volts. As such, switches 112 and 114 are open. However, due to the 1 μA current across the variable resistor 96, the local voltage $V_{be}$ may cause the switches 102 and 104 to close, thereby coupling node 116 to voltage source VSS. The node 116 may correspond to the output (cmpout) of the comparator circuit 92. Referring briefly to FIG. 5, the comparator output (cmpout) may be coupled to a first inverter 118, which may be coupled to a second inverter 120. The output of the second inverter 120 may be coupled to a P-type switch 122 that may control a connection between the voltage source VDD and the node 76, which corresponds to the output voltage $V_{bgr}$. The first inverter 118 and the second inverter 120 may be included in the startup circuit 50 to better isolate the comparator output (cmpout) signal. As such, in some embodiments, the first inverter 118 and the second inverter 120 may not be included between the comparator output (cmpout) and the gate of the switch 122.

In any case, as mentioned above, when the bandgap circuit 40 is initialized, the comparator output (cmpout) may be coupled to the voltage source VSS, thereby providing a low (e.g., negative) voltage signal to the gate of the switch 122. As such, the switch 122 may close and couple the node 76 to the voltage source VDD and cause the output voltage $V_{bgr}$ to increase to a voltage level that corresponds to the voltage level provided by the voltage source VDD. In this way, as soon as the bandgap circuit 40 is initialized, the output voltage $V_{bgr}$ is pulled up to the voltage level provided by the voltage source VDD by the startup circuit 50.

As the output voltage $V_{bgr}$ increases, the voltages provided to the gates of the switches 112 and 114 may increase past the respective gate thresholds and cause the switches 112 and 114 to close. As a result, node 124 of the comparator circuit 92 may be coupled to the voltage source VSS, thereby causing P-type switches 126, 128, 130, 132 to close via nodes 134 and 136. After switches 126, 128, 130, 132 close, the voltage source VDD may be coupled to the comparator output (cmpout) and may cause the voltage level of the comparator output (cmpout) to increase. Referring again to FIG. 5, as the voltage level of the comparator output (cmpout) increases, the voltage provided to the gate of the switch 122 may no longer be at the threshold level to cause the switch 122 to remain closed. As a result, the switch 122 may open and the startup circuit 50 may be in an off-state. However, since the output voltage $V_{bgr}$ has increased while the startup circuit was in an on-state, the bandgap circuit 40 may begin to pull the output voltage $V_{bgr}$ up and maintain the expected voltage level using the differential op-amp circuit 42.

Figure 6:
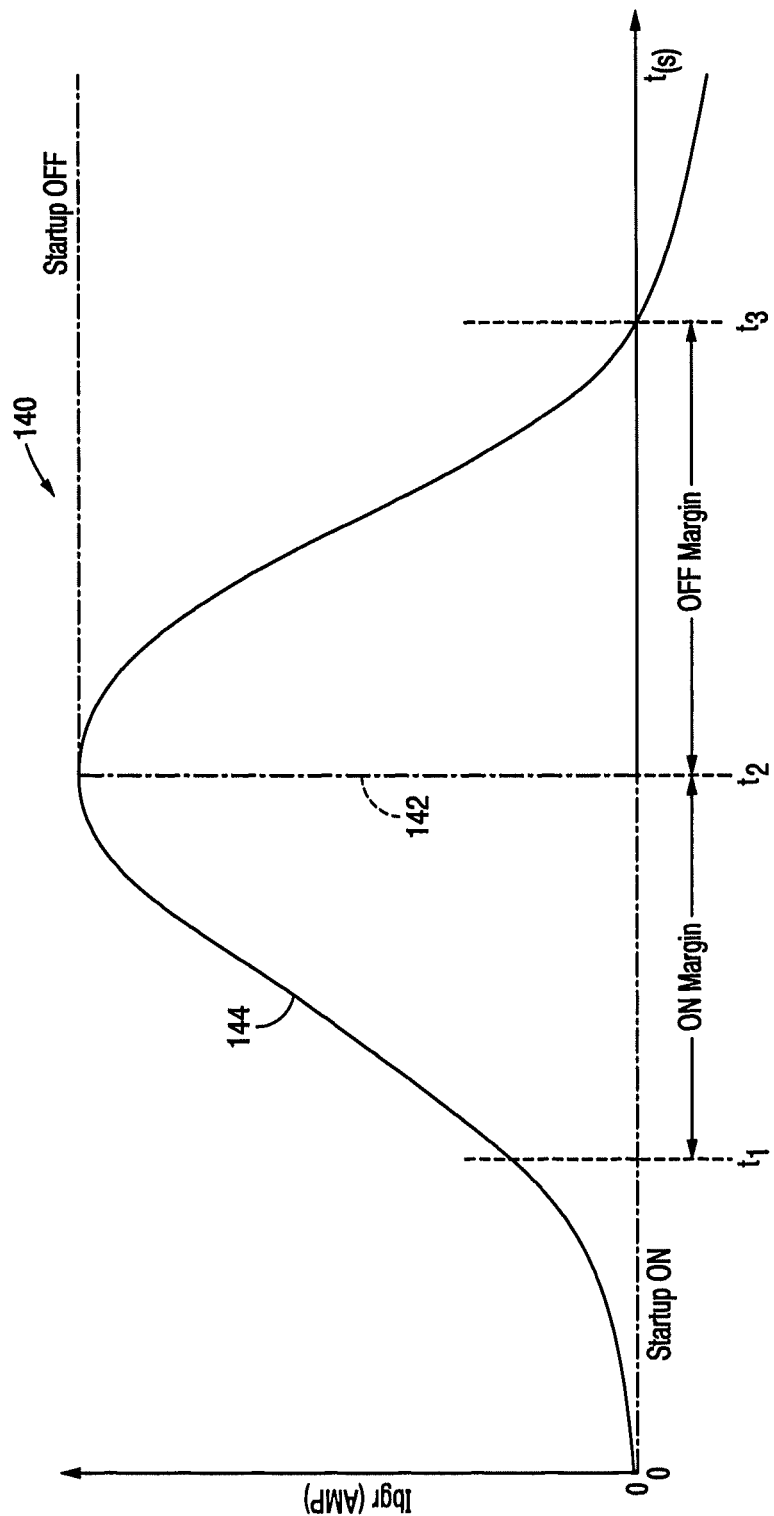
FIG. 6 is a timing diagram of a number of waveforms representative of an operation scenario of the bandgap circuit of FIG. 2 using the startup circuit of FIG. 4, according to an embodiment of the present disclosure.

FIG. 6 is a timing diagram that illustrates the operation of the startup circuit 50 with respect to the output current $I_{bgr}$ (e.g., see FIG. 2) produced by the bandgap circuit 40 during operation. As shown in FIG. 6, at time 0, the startup circuit 50 may be on. That is, the voltage of the comparator output (cmpout), as represented by line 142, may be a relatively low voltage. As discussed above, the low voltage of the comparator output (cmpout) may be provided to the gate of the switch 122, thereby connecting the voltage source VDD to the node 76 and increasing the voltage of the output voltage $V_{bgr}$.

After the startup circuit 50 connects the voltage source VDD to the node 76, the output current $I_{bgr}$ begins to increase, as shown by line 144. At time $t_1$, the output voltage $V_{bgr}$ may reach a threshold level that the bandgap circuit 40 may start to pull up the output voltage $V_{bgr}$ itself to achieve the constant output voltage. As such, after the output voltage $V_{bgr}$ reaches some threshold, the startup circuit 50 should be powered off. For example, at time $t_2$, when the output current $I_{bgr}$ reaches its peak value, the output voltage $V_{bgr}$ may pass the threshold that causes the switches 112 and 114 to close, thereby increasing the voltage of the comparator output (cmpout) to cause the switch 122 to open. At time $t_3$, the output current $I_{bgr}$ reaches 0 and and the output voltage $V_{bgr}$ is stable at the designed voltage value (e.g., 1.2 volts).

By using the startup circuit 50 described herein, the bandgap circuit 40 may begin to operate to pull up the output voltage $V_{bgr}$ after the bandgap circuit 40 is biased to approximately 25% of its normal operation. That is, if the normal operation of the bandgap circuit 40 includes a bias current of 2 µA, by using the startup circuit 50, the bandgap circuit 40 may begin to pull its output voltage $V_{bgr}$ after it is biased at 0.5 µA.

Moreover, by employing the startup circuit 50 described herein, the bandgap circuit 40 may vary across a range of process, voltage, and temperature values, as compared to startup circuits that do not mimic the operation of a respective bandgap circuit. Indeed, since the startup circuit 50 described herein is a replica circuit of the main amplifier in the bandgap circuit 40, the startup circuit 50 mimics the operation of the differential op-amp circuit 42 to better link the operations of the two circuits.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A startup circuit, comprising:
a first set of switches configured to couple a first voltage source to a first node;
a second set of switches configured to couple a second voltage source to the first node;
a third set of switches configured to control the second set of switches, wherein the third set of switches is configured to close based on a voltage output by a bandgap circuit;
a resistor configured to couple to the first set of switches, wherein an end node of the resistor corresponds to a local voltage configured to control the first set of switches, wherein the first node is configured to receive a first voltage that corresponds to the first voltage source until the voltage output by the bandgap circuit exceeds a threshold associated with the third set of switches closing, wherein a set of gates for the second set of switches is configured to receive the first voltage in response to the third set of switches closing, wherein the second set of switches is configured to cause the first node to receive a second voltage that corresponds to the second voltage source in response to the second set of switches closing; and
a switch configured to couple the second voltage source to a second node that is coupled to the voltage output by the bandgap circuit, wherein the switch is configured to close in response to the first node having the first voltage.

2. The startup circuit of claim 1, wherein the first set of switches, the second set of switches, and the third set of switches mimic a plurality switches of the bandgap circuit.

3. The startup circuit of claim 2, wherein the first set of switches, the second set of switches, and the third set of switches are scaled down as compared to the plurality switches of the bandgap circuit.

4. The startup circuit of claim 1, wherein the resistor comprises a variable resistor.

5. The startup circuit of claim 1, comprising a first inverter and a second inverter coupled in series with the first node and a gate of the switch.

6. The startup circuit of claim 1, wherein the first set of switches and the third set of switches comprise a plurality of N-type switches, and wherein the second set of switches comprises a plurality of P-type switches.

7. The startup circuit of claim 1, wherein the resistor is configured to couple to a current mirror circuit.

8. The startup circuit of claim 1, wherein the switch is configured to open in response to the first node being coupled to the second voltage source.

9. The startup circuit of claim 1, comprising a fourth set of switches configured to couple the second set of switches to the first set of switches and the third set of switches.

10. A semiconductor device comprising:
a bandgap circuit configured to output a reference voltage;
a startup circuit coupled to the bandgap circuit, wherein the startup circuit is configured to:
connect a voltage source to a node that corresponds to an output of the bandgap circuit in response to the bandgap circuit being initialized, wherein the startup circuit is configured to connect the voltage source to the node by connecting a second voltage source to a second node via a plurality of switches in response to the bandgap circuit being initialized, wherein a voltage of the second node is configured to cause a switch coupled between the voltage source and the node to close; and
disconnect the voltage source from the node in response to the reference voltage being greater than a threshold.

11. The semiconductor device of claim 10, wherein the plurality of switches is configured to couple the second voltage source to the second node based on a voltage across a resistor configured to couple to a current mirror circuit.

12. The semiconductor device of claim 10, wherein the startup circuit is configured to disconnect the voltage source from the node by connecting the voltage source to the second node via a second plurality of switches in response to the reference voltage being greater than the threshold, wherein the voltage of the second node is configured to cause a switch coupled between the voltage source and the node to open due to the voltage source coupling to the second node.

13. The semiconductor device of claim 10, wherein the bandgap circuit comprises a differential op-amp circuit.

14. The semiconductor device of claim 10, wherein the bandgap circuit is configured to provide the reference voltage to one or more components of a memory device.

15. The semiconductor device of claim 10, wherein the reference voltage is used as an input to the startup circuit.

16. A method, comprising:
coupling, via a circuit, a first voltage source to a first node via a first set of switches, wherein the first set of switches is configured to close based on a local voltage provided via a current mirror circuit and a resistor;
coupling, via the circuit, a second voltage source to a second node in response to the first voltage source coupling to the first node, wherein the second node corresponds to a voltage output by a bandgap circuit, and wherein the first voltage source is configured to assist the bandgap circuit increase the voltage output;
coupling, via the circuit, the first voltage source to a set of gates that corresponds to a second set of switches, wherein the first voltage source is configured to couple to the set of gates via a third set of switches, and wherein the third set of switches is configured to operate based on the voltage output;
coupling, via the circuit, the second voltage source to the first node in response to the second set of switches closing, wherein the second set of switches is configured to close in response to the first voltage source being coupled to the set of gates; and
disconnecting, via the circuit, the second voltage source from the second node in response to the second voltage source being coupled to the first node.

17. The method of claim 16, wherein the first set of switches and the third set of switches comprise N-type switches, and wherein the second set of switches comprise P-type switches.

18. The method of claim 16, wherein the first voltage source comprises a negative voltage source or an electrical ground.

19. The method of claim 18, comprising adjusting, via the circuit, a resistance of the resistor, wherein the resistor comprises a variable resistor.

\* \* \* \* \*